United States Patent
Chen et al.

(10) Patent No.: US 11,188,692 B2
(45) Date of Patent: Nov. 30, 2021

(54) TURBULENT BOUNDARY LAYER MODELING VIA INCORPORATION OF PRESSURE GRADIENT DIRECTIONAL EFFECT

(71) Applicant: Dassault Systemes Simulia Corp., Johnston, RI (US)

(72) Inventors: Hudong Chen, Newton, MA (US); Raoyang Zhang, Burlington, MA (US); Yanbing Li, Westford, MA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 372 days.

(21) Appl. No.: 16/294,242

(22) Filed: Mar. 6, 2019

(65) Prior Publication Data
US 2020/0285710 A1 Sep. 10, 2020

(51) Int. Cl.
*G06F 30/20* (2020.01)

(52) U.S. Cl.
CPC .................... *G06F 30/20* (2020.01)

(58) Field of Classification Search
CPC .......... G06F 30/20; G06F 30/17; G06F 17/13; G06F 2111/10; G06F 30/25; G06T 17/20
USPC ........................................................ 703/2, 6
See application file for complete search history.

(56) References Cited

U.S. PATENT DOCUMENTS

| 5,910,902 A * | 6/1999 | Molvig | G06F 30/23 703/6 |
|---|---|---|---|
| 9,542,506 B2 * | 1/2017 | Chen | G06F 30/23 |
| 2009/0171596 A1 | 7/2009 | Houston | |
| 2013/0246024 A1 | 9/2013 | Rodriguez et al. | |
| 2014/0136159 A1 * | 5/2014 | Chen | G06F 17/11 703/2 |
| 2017/0109464 A1 * | 4/2017 | Chen | G06F 30/20 |
| 2018/0266395 A1 * | 9/2018 | Abramov | G06F 30/23 |

OTHER PUBLICATIONS

Humble et al., "Experimental Investigation of the Three-Dimensional Structure of a Shock Wave/Turbulent Boundary Layer Interaction," 16th Australasian Fluid Mechanics Conference, 2011, 729-36.

(Continued)

*Primary Examiner* — Thai Q Phan
(74) *Attorney, Agent, or Firm* — Fish & Richardson P.C.

(57) ABSTRACT

Disclosed are techniques for performing a flow simulation that include storing in a memory state vectors for a plurality of voxels, the state vectors comprising a plurality of entries that correspond to particular momentum states of a plurality of possible momentum states at a voxel. The techniques also include storing in a memory a representation of at least one surface and performing interaction operations on the state vectors, the interaction operations modelling interactions between elements of different momentum states. The techniques also include performing surface interaction operations which model interactions between the surface and elements of at least one voxel near the surface, including modeling a wall shear stress direction that is not parallel to a flow velocity direction and performing move operations on the state vectors to reflect movement of elements to new voxels.

18 Claims, 10 Drawing Sheets

(56) References Cited

OTHER PUBLICATIONS

Jodai et al., "Experimental observation of hairpin auto-generation events in a turbulent boundary layer," J. Fluid Mech., 2016, 795:611-33.
Morgan, et al., "A Parametric Investigation of Oblique Shockwave/ Turhulent Boundary Layer Interaction Using LES," 41st AIAA Fluid Dynamics Conference and Exhibit, 2011, 1-19.
Van Treek, et al., "Extension of a hybrid thermal LBE scheme for large-eddy simulations of turbulent convective flows," Computers & Fluids, 2005, 35:863-71.

* cited by examiner

FIG. 3
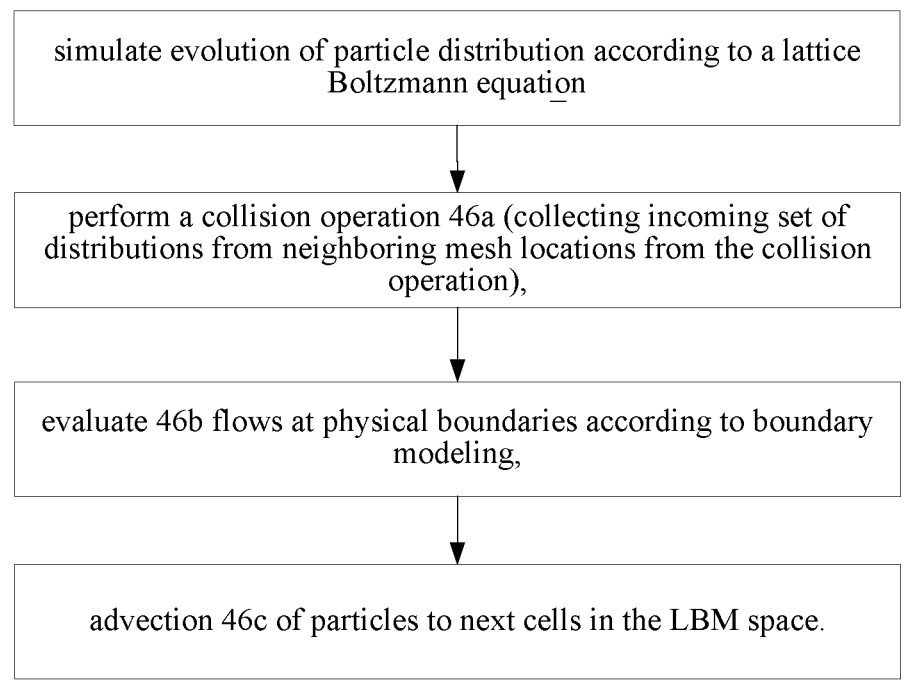
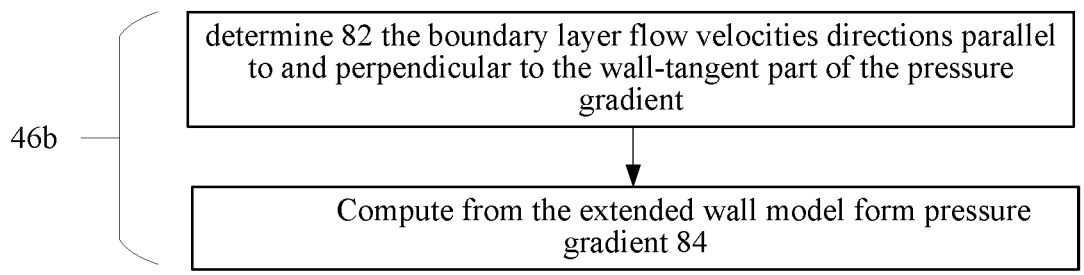
FIG. 6

TURBULENT BOUNDARY LAYER MODELING VIA INCORPORATION OF PRESSURE GRADIENT DIRECTIONAL EFFECT

BACKGROUND

This description relates to computer simulation of physical processes, such as physical fluid flows.

High Reynolds number flow has been simulated by generating discretized solutions of the Navier-Stokes differential equations by performing high-precision floating point arithmetic operations at each of many discrete spatial locations on variables representing the macroscopic physical quantities (e.g., density, temperature, flow velocity). Another approach replaces the differential equations with what is generally known as lattice gas (or cellular) automata, in which the macroscopic-level simulation provided by solving the Navier-Stokes equations is replaced by a microscopic-level model that performs operations on particles moving between sites on a lattice.

Turbulent flows involve a wide range of spatial and temporal scales. In general, to fully resolve all these scales in a direct numerical simulation (DNS) may be difficult. Generally, in order to numerically solve turbulent flow problems, only the large-scale part of the flows are computed. The smaller scales are generally located in the so called turbulent boundary layer regions near a solid wall, and a boundary layer model is used to approximate the physical effects of the unresolved smaller scales to ensure proper fluxes of mass, momentum, and energy at the solid wall.

SUMMARY

According to an aspect, a computer-implemented method for simulating a physical process includes storing in a memory a momentum state for locations in a simulation space, storing in the memory a representation of at least one surface, performing interaction operations on different momentum states for at least some of the locations, performing surface interaction operations which model interactions between the surface and a location near the surface, including modeling a wall shear stress direction that is not parallel to a boundary layer flow velocity direction, and performing move operations on the locations to reflect movement of elements to new locations.

The following are some embodiments within the scope of the above aspect. Storing in the memory the momentum state includes storing, in the memory state, vectors for a plurality of voxels, the state vectors comprising a plurality of entries that correspond to particular momentum states of a plurality of possible momentum states at a voxel. Performing interaction operations on different momentum states for at least some of the locations includes performing interaction operations on the state vectors, the interaction operations modelling interactions between elements of different momentum states. The surface operations model interactions between the surface and elements of at least one voxel near the surface. The locations are represented as voxels. Performing surface interaction operations accounts for perpendicular pressure components. Performing surface interaction operations include evaluating the boundary layer flow velocity according to two velocity directions.

BRIEF DESCRIPTION OF THE DRAWINGS

FIG. 3 depicts a flow chart showing simulation operations using the Lattice Boltzmann model with the turbulent boundary layer model.

FIG. 6 depicts a flow chart showing aspects of the turbulent boundary layer model.

DETAILED DESCRIPTION

In a LBM-based physical process simulation system, fluid flow is represented by the distribution function values $f_i$, evaluated at a set of discrete velocities $c_i$. The dynamics of the distribution function is governed by the equation below, where $f_i(0)$ is known as the equilibrium distribution function, defined as:

$$f_\alpha^{(0)} = w_\alpha \rho \left[ 1 + u_\alpha + \frac{u_\alpha^2 - u^2}{2} + \frac{u_\alpha(u_\alpha^2 - 3u^2)}{6} \right] \qquad \text{Eq.(I-1)}$$

This equation is the well-known lattice Boltzmann equation that describe the time-evolution of the distribution function, $f_i$. The left-hand side represents the change of the distribution due to the so-called "streaming process." The streaming process is when a pocket of fluid starts out at a grid location, and then moves along one of the velocity vectors to the next grid location. At that point, the "collision factor," i.e., the effect of nearby pockets of fluid on the starting pocket of fluid, is calculated. The fluid can only move to another grid location, so the proper choice of the velocity vectors is necessary so that all the components of all velocities are multiples of a common speed.

The right-hand side of the first equation is the aforementioned "collision operator" which represents the change of the distribution function due to the collisions among the pockets of fluids. The particular form of the collision operator used here is due to Bhatnagar, Gross and Krook (BGK). It forces the distribution function to go to the prescribed values given by the second equation, which is the "equilibrium" form.

From this simulation, conventional fluid variables, such as mass $\rho$ and fluid velocity u, are obtained as simple summations. Here, the collective values of $c_i$ and $w_i$ define a LBM model. The LBM model can be implemented efficiently on scalable computer platforms and run with great robustness for time unsteady flows and complex boundary conditions.

A standard technique of obtaining the macroscopic equation of motion for a fluid system from the Boltzmann equation is the Chapman-Enskog method in which successive approximations of the full Boltzmann equation are taken.

In a fluid system, a small disturbance of the density travels at the speed of sound. In a gas system, the speed of the sound is generally determined by the temperature. The importance of the effect of compressibility in a flow is measured by the ratio of the characteristic velocity and the sound speed, which is known as the Mach number.

Figure 1:
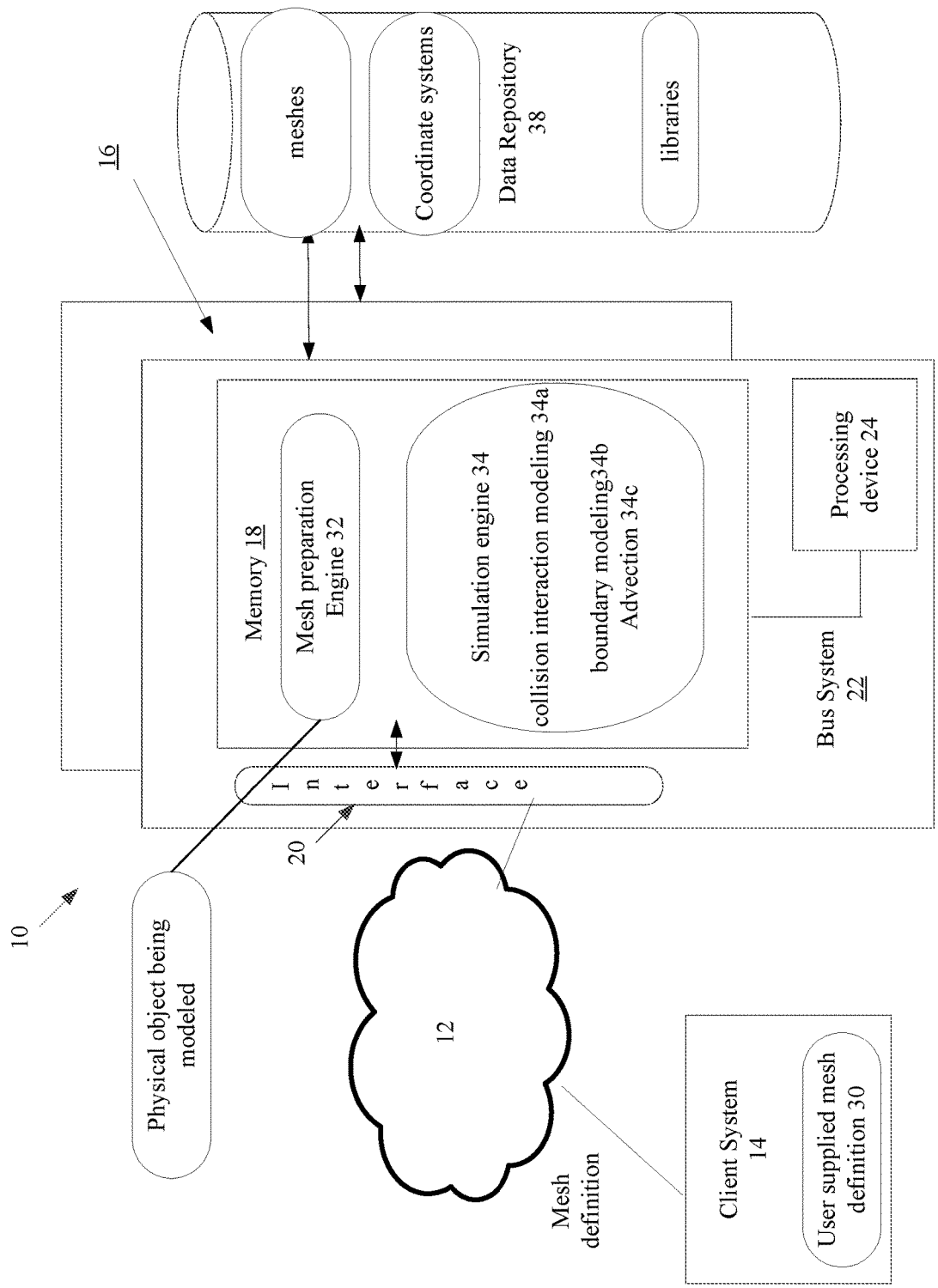
FIG. 1 depicts a system for simulation of fluid flows, which includes a turbulent boundary layer model for compressible flows.

Referring now to FIG. 1, a system 10 that includes a turbulent boundary layer model that incorporates pressure gradient directional effect 34b for high speed and compressible flows is described. The system 10 in this implementation is based on a client-server or cloud based architecture and includes a server system 12 implemented as a massively parallel computing system 12 (stand alone or cloud-based) and a client system 14. The server system 12 includes memory 18, a bus system 11, interfaces 20 (e.g., user interfaces/network interfaces/display or monitor interfaces, etc.) and a processing device 24. In memory 18 are a mesh preparation engine 32 and a simulation engine 34.

While FIG. 1 shows the mesh preparation engine 32 in memory 18, the mesh preparation engine can be a third party application that is executed on a different system than server 12. Whether the mesh preparation engine 32 executes in memory 18 or is executed on a different system than server 12, the mesh preparation engine 32 receives a user-supplied mesh definition 30 and the mesh preparation engine 32 prepares a mesh and sends (and or stores) the prepared mesh to the simulation engine 34 according to a physical object that is being modelled for simulation by the simulation engine 34. The simulation engine 34 includes collision interaction module 34a, boundary module 34b and advection particle collision interaction module 34c. The system 10 accesses a data repository 38 that stores 2D and/or 3D meshes (Cartesian and/or curvilinear), coordinate systems, and libraries.

Figure 2:
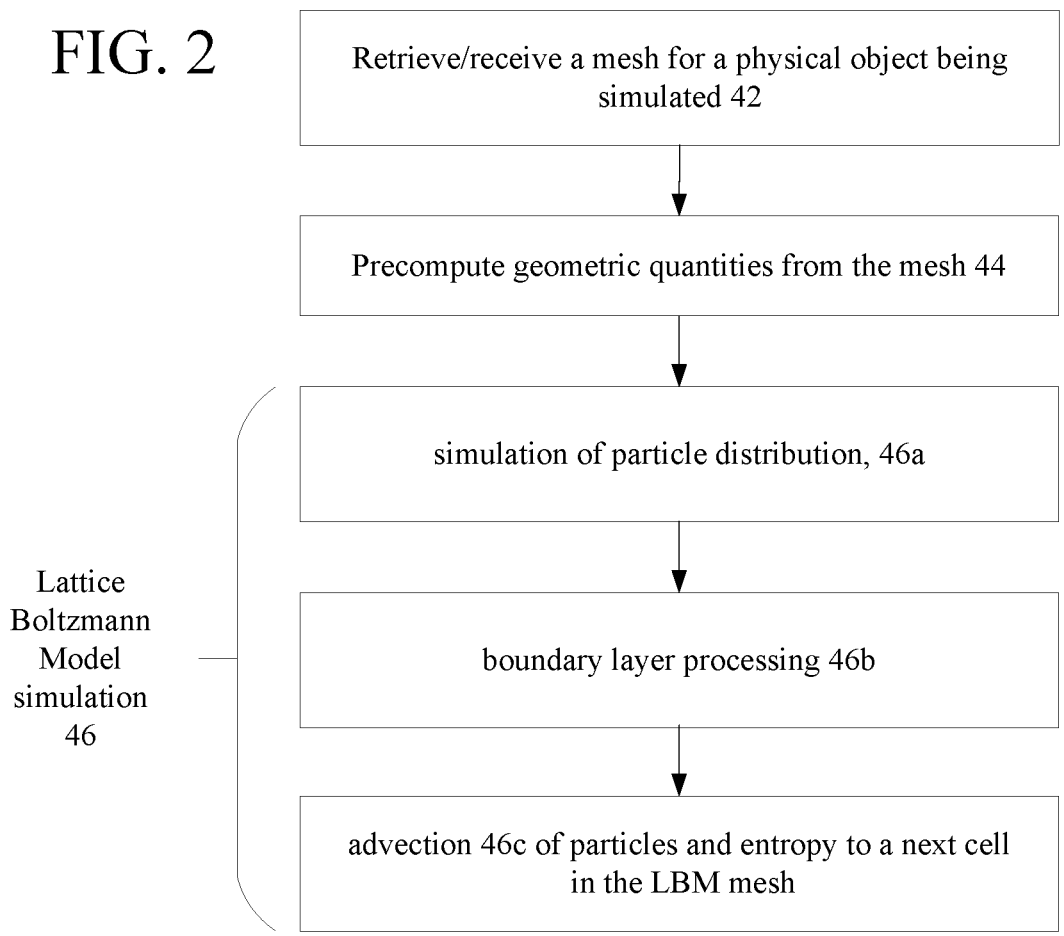
FIG. 2 depicts a flow chart showing operations for formulation of a Lattice Boltzmann Model simulation with the turbulent boundary layer model.

Referring now to FIG. 2, a process 40 for simulating fluid flow about a representation of a physical object is shown. In the example that will be discussed herein, the physical object is an airfoil. The use of an airfoil is merely illustrative however, as the physical object can be of any shape, and in particular can have planar and/or curved surface(s). The process 40 receives 42, e.g., from client system 14 or retrieves from the data repository 38, a mesh (or grid) for the physical object being simulated. In other embodiments, either an external system or the server 12 based on user input, generates the mesh for the physical object being simulated. The process precomputes 44 geometric quantities from the retrieved mesh and performs dynamic Lattice Boltzmann Model simulation 46 using the precomputed geometric quantities corresponding to the retrieved mesh. Lattice Boltzmann Model simulation includes the simulation 46a of evolution of particle distribution, performs boundary layer processing 46b when the flow impacts a physical surface, and performs advection 46c of particles to a next cell in the LBM mesh.

Referring now to FIG. 3, the simulation process 46 simulates evolution of particle distribution according to a lattice Boltzmann equation (LBE). The process 46 (see FIG. 2) performs a collision operation 46a (and collecting an incoming set of distributions from neighboring mesh locations from the collision operation), evaluates 46b flows at physical boundaries according to boundary modeling, and an advection 46c of particles to next cells in the LBM space.

Boundary Modeling

Figure 4:
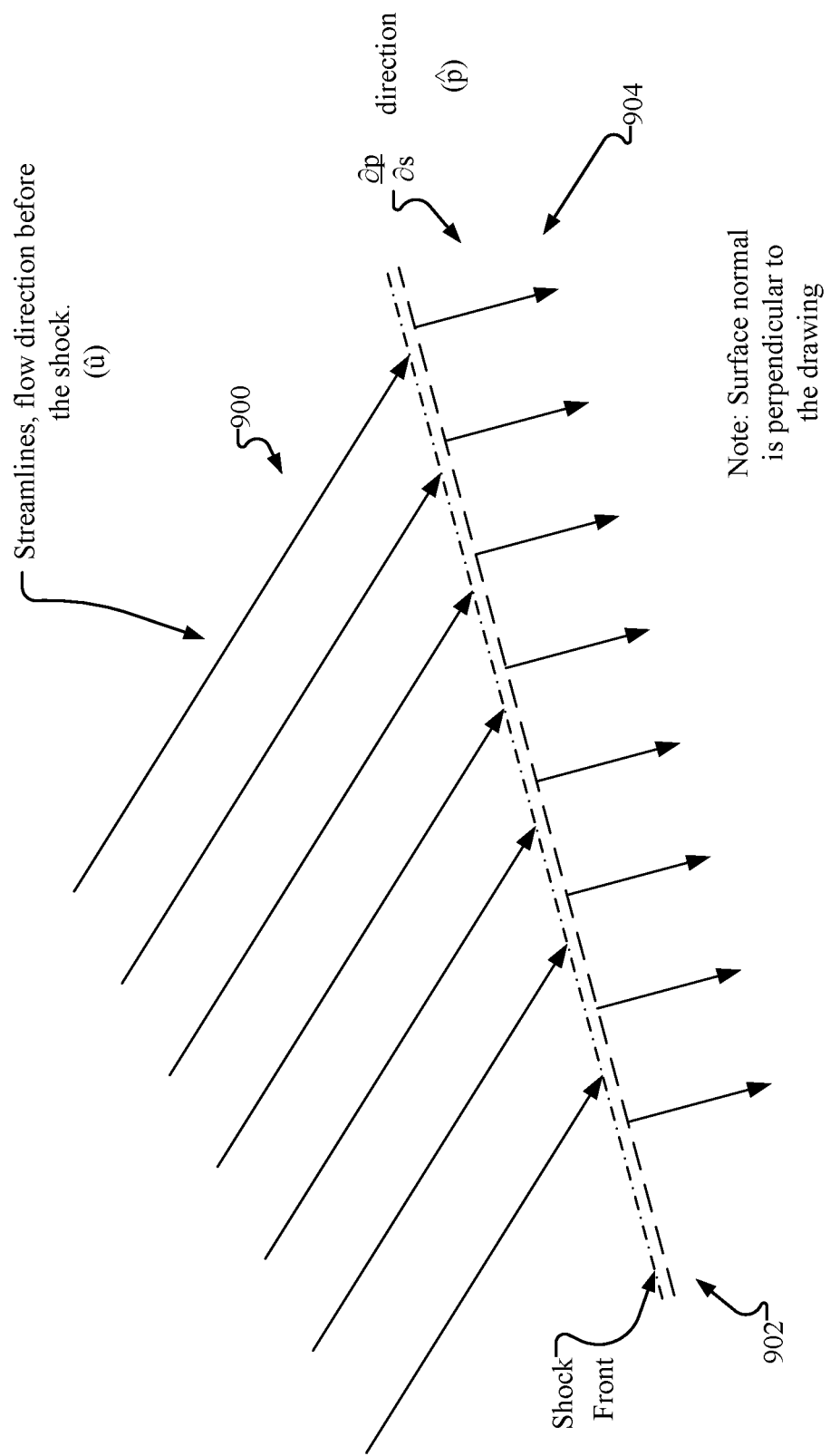
FIG. 4 illustrates the change in direction of a flow when experiencing a shock front.

Referring now to FIG. 4, change in direction of a flow when experiencing a shock front is illustrated. To correctly simulate interactions with a surface, each facet meets four boundary conditions. First, the combined mass of particles received by a facet should be equal to the combined mass of particles transferred by the facet (i.e., the net mass flux to the facet must equal zero). Second, the combined energy of particles received by a facet should be equal to the combined energy of particles transferred by the facet (i.e., the net energy flux to the facet equals zero). These two conditions may be satisfied by requiring the net mass flux at each energy level (i.e., energy levels one and two) to equal zero.

A boundary layer model can model the wall shear stress (friction) corresponding to the usual no-slip boundary condition that governs the momentum flux occurring at a solid wall, as, $$u_*^2 = v_0 \frac{\partial u}{\partial y}\bigg|_{y=0} \qquad \text{Eq.(I-2)}$$

where the gradient value is taken at the wall (y=0), $u_*$ is the so-called friction velocity (=square-root of the wall shear stress, $\sqrt{\tau_w/\rho}$, and $\rho$–fluid mass density), and $v_0$ is the molecular kinematic viscosity of the flow. Accurate calculation of this gradient requires resolving the velocity field into very tiny scales up to the wall, which is impractical. A central task in turbulence modeling is to approximate the wall shear stress without directly computing velocity gradient at the wall. This is known as turbulent boundary layer modeling (or wall modeling) in the field of turbulence and computational fluid dynamics.

The formulation of a turbulent boundary layer model resides on the foundation of a fundamental phenomenon of turbulence known as the "law of the wall." That is, if a solid wall is sufficiently flat and a turbulent flow is fully attached along it, over a wide range of locations measured in terms of distance from the wall, the time-averaged velocity profile of a turbulent flow has a known specific, i.e., "universal" form.

This "universal" form is preserved under a scale transformation by certain local intrinsic physics properties such as wall shear stress. Thus, the following expression can be used for the velocity profile, $$U(y)/u_* = \frac{1}{\kappa}\log(y^+) + B \qquad (\text{Eq. 1})$$

where U(y) is the averaged fluid velocity value along the solid wall measured at distance y from the wall and B is a constant (empirically found to have a value of about 5). The quantity $y^+$ is a dimensionless distance from the wall defined as:

$$y^+ = \frac{y\, u_*}{v_0}$$

The constant $\kappa$ is the so-called von Karman constant (empirically found to have a value of about 0.41). The logarithmic function form is valid for a wide range of $y^+$ values roughly from 50 to a few hundred or higher. The basic wall model functional form (Eq. 1) can be expanded to cover a wider range of $y^+$ values that include the viscous and transitional sub-layers, $0<y^+<50$. The expanded form is given below, $$U(y)=u_* F(y^+) \qquad (\text{Eq. 2})$$

It is generally accepted that $$F(y^+) = y^+ \text{ for } 0 < y^+ \leq 5; F(y^+) = \frac{1}{\kappa}\log(y^+) + B,$$

for $y^+ \geq 50$; and a transitional profile form is used for $5 < y^+ < 50$.

This "law of the wall," however, is generally only applicable when a boundary layer flow is fully attached along a perfectly flat solid wall, such that velocity variation parallel to the wall is negligible compared to that normal to the wall, which is known as the equilibrium condition. Equation (Eq. 1) defines a relation between the velocity profile (velocity as a function of distance from the wall) and the surface skin-friction. This provides a basis for determining skin-friction without the need of the (unresolvable) velocity gradient information at the wall, which is an observation pertaining to the physics of turbulent boundary layer modeling. The wall shear stress vector defines an effective force by the solid surface acting on the fluid in the direction opposite to the flow velocity direction $$\tau_n = -\rho u_*^2 \hat{u} \tag{Eq. 3}$$

where here $\hat{u}$ is the unit vector in the direction of the flow velocity 900.

However, a solid wall (shock front 902) is often not flat. Therefore, it is desirable to extend the "law of the wall" to non-equilibrium situations where there is flow variation in the stream-wise direction caused by, for example, wall curvature. It is known that the leading order effect of curvature to a turbulent boundary layer profile is the presence of a pressure gradient. Various extensions of the basic wall model have been made, which are generally modifications of equation (Eq. 1) to include terms proportional to pressure gradient.

One such extension is described in US Patent (U.S. Pat. No. 5,910,902A), incorporated herein in by reference in its entirety, which patent describes an advanced extension of the basic wall model (Eq. 1) using a specific way to include the pressure gradient effect based on an argument of self-similarity of the boundary layer profile under the influence of a pressure gradient. A generic form of this extension is written as:

$$U(y) = u_* F\left(y^+/\xi\left(\frac{dp}{ds}\right)\right) \tag{Eq. 4}$$

where $\xi(x)$ is a dimensionless positive function of x. dp/ds denotes the stream-wise (parallel to local fluid velocity) pressure gradient component, $$\frac{dp}{ds} = \nabla p \cdot \hat{s}$$

where $\hat{s}$ is the unit vector in the stream-wise direction. This approach enables the accurately simulation of flows around objects of arbitrary shape, including accurate prediction of boundary layer flow separations.

Existing turbulent boundary layer modeling (including that described in the above U.S. Pat. No. 5,910,902A) assumes that the pressure gradient direction is parallel to the velocity direction in the boundary layer. That is, the extensions to equation (2), such as equation (4), only take into account the stream-wise pressure gradient component contribution, while ignoring the perpendicular pressure component. While this is reasonable for addressing the effect of geometric curvature in the direction of flow, yet it happens that flow along a solid surface is not always in the same direction as the curvature direction. For example, consider a cylinder with its main axis forming an angle (0<θ<90) with respect to the direction of flow. As, a consequence of this geometry, the resulting pressure gradient is neither parallel nor perpendicular to the flow direction. Therefore, a generalization to existing turbulent boundary layer modeling is needed to properly capture the effect of curvature on non-parallel boundary layer flow.

Figure 5:
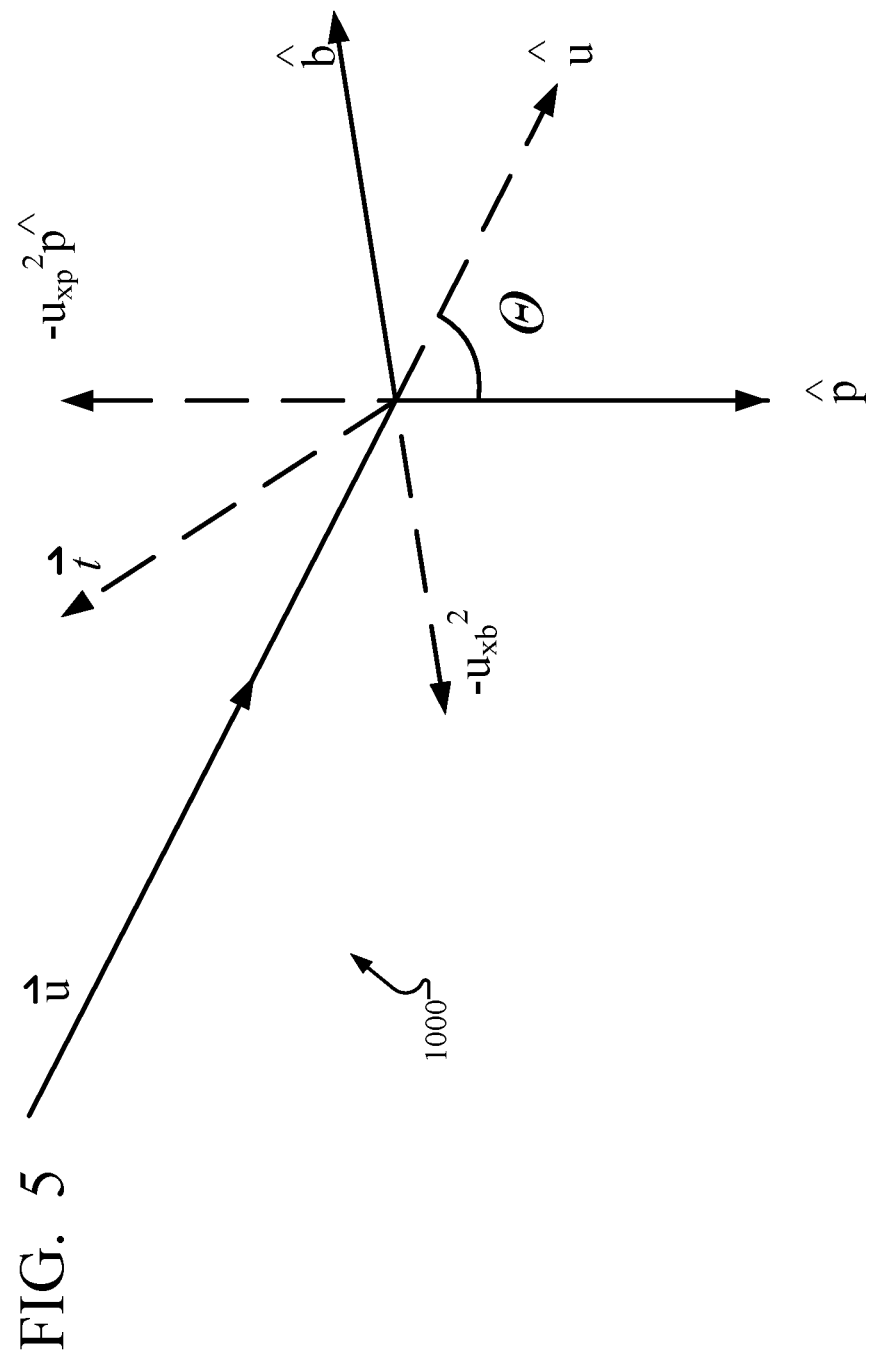
FIG. 5 illustrates a pressure gradient decomposed into components along three orthogonal directions.

Referring to FIG. 5, as implied above, the pressure gradient can be decomposed into components along three orthogonal directions 70, a direction normal to the wall, and two directions both tangential to the wall, but with one direction the "stream-wise" direction being parallel to the averaged velocity in the boundary layer and the other direction the "span-wise" direction being perpendicular to the wall. Generally, conventional extended wall models the stream-wise pressure gradient component contribution is included, while the span-wise component is ignored or not recognized.

The turbulent boundary layer modeling described herein starts with a different way to deal with the relationship between the pressure gradient direction and the flow velocity direction. Instead of decomposing pressure gradient into the above mentioned three directions (normal to the wall, and two tangential directions, i.e., "stream-wise" and "span-wise"), the process decomposes the boundary layer flow velocity into three directions.

Since the velocity is tangential to the wall, the velocity component normal to the wall is zero, so there are in effect only two velocity directions, i.e., a first direction parallel to the wall-tangent part of the pressure gradient and a second direction perpendicular to the wall-tangent part of the pressure gradient.

Therefore, the velocity vector U can be expressed as:

$$U = U_p \hat{p} + U_b \hat{b} \tag{Eq. 5}$$

where $\hat{p}$ 904 and $\hat{b}$ are the wall-tangent unit vectors that are parallel to and perpendicular to the wall-tangent part of the pressure gradient direction, respectively. The velocity components are expressed by:

$$U_p = U \cdot \hat{p} \tag{Eq. 6a}$$

$$U_b = U \cdot \hat{b} \tag{Eq. 6b}$$

Having decomposed the boundary layer velocity into these two components, it is straightforward to apply appropriate wall modeling based on their two different directions. For the velocity component perpendicular to the pressure gradient, the basic law of the wall model is adopted as in (Eq. 2), namely:

$$U_b(y) = u_{*b} F(y^+) \tag{Eq. 7a}$$

where the friction velocity $u_{*b}$ corresponds to the skin-friction perpendicular to the pressure gradient direction. In contrast, the extended wall model form (equation (4)) is used for the velocity component parallel to the pressure gradient:

$$U_p(y) = u_{*p} F\left(y^+/\xi\left(\frac{dp}{ds}\right)\right) \tag{Eq. 7b}$$

Therefore, the pressure gradient effect is only applied to the parallel component of the boundary layer velocity. In the above, $u_{*_p}$ corresponds to the skin-friction parallel to the pressure gradient direction.

In addition, a more careful definition of the stream-wise pressure gradient dp/ds 904 is provided compared to that which has previously been defined and understood. As discussed above, in conventional understanding, dp/ds is the pressure gradient component in the stream-wise direction, that is, the projection of the pressure gradient in the direction of the boundary layer velocity:

$$\frac{dp}{ds} = \nabla p \cdot \hat{u} \qquad \text{(Eq. 8)}$$

In contrast with conventional understanding, dp/ds is defined herein as the component of the pressure gradient tangential to the solid surface, which in general is not the same as the velocity direction. Explicitly, dp/ds according to this interpretation is defined as:

$$\frac{dp}{ds}\hat{t} = \nabla p - \hat{n}\hat{n} \cdot \nabla p$$

where $\hat{n}$ is the unit vector normal to the solid surface, and the unit vector $\hat{t}$ is in the direction of projected pressure gradient tangential to the surface (equivalent to the unit vector $\hat{p}$ defined in {Eq. 5).

The absolute value of the new dp/ds is, in general, greater than that of the conventional definition, because $$\frac{dp}{ds}(\text{old}) = \hat{u} \cdot \hat{t} \frac{dp}{ds}(\text{new}).$$

Consequently, the resulting pressure gradient effect is slightly stronger in the new extended wall model. Most importantly, since in general the boundary layer velocity is not parallel to the (tangential part of) the pressure gradient, the resulting skin friction force is no longer parallel to the velocity direction.

Combining all the above, results in a new representation of wall shear stress given as:

$$\tau_n = -\rho(u_{*_p}^2 \hat{p} + u_{*_b}^2 \hat{b}) \qquad \text{(Eq. 9)}$$

It is seen that since $u_{*_p}$ is in general not equal to $u_{*_b}$, the wall shear stress direction is not parallel to the flow velocity direction. This feature is believed to be lacking in all previous turbulent boundary layer models. It is expected therefore that the described extended wall model will show a substantial improvement for solid wall surfaces that are not flat, therefore, extending the "law of the wall" to non-equilibrium situations where there is flow variation in the stream-wise direction caused by, for example, wall curvature, over conventional wall models. The non-parallel skin friction force effect of the disclosed wall model may provide more accurate predictions of a boundary layer turning phenomena due to presence of a near-wall shock on a curved surface.

Referring to FIG. 6, a turbulent boundary layer model is evaluated. The turbulent boundary layer model determine 82 the boundary layer flow velocities. While there are three directions, the velocity component normal to the wall is considered as zero, so in effect only two velocity directions are determined, i.e., a first direction parallel to the wall-tangent part of the pressure gradient and a second direction perpendicular to the wall-tangent part of the pressure gradient see Eq. 6a and Eq. 6b (above).

Using the two components of the boundary layer velocity Eq. 6a and Eq. 6b (above), the turbulent boundary layer model computes pressure gradients 84 based on these velocity components, by applying in the extended wall model form the velocity component parallel to the pressure gradient given above in Eq. 9, as wall shear stress in which the wall shear stress direction is not parallel to the flow velocity direction.

Figure 7:
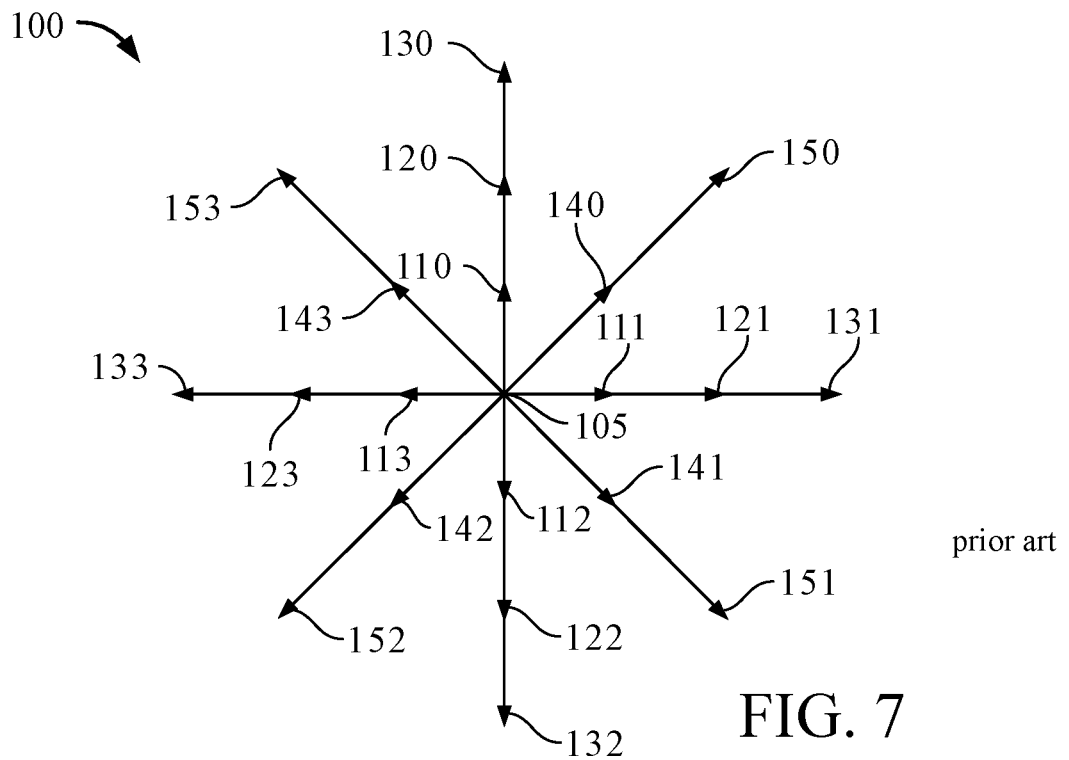
FIGS. 7 and 8 illustrate velocity components of two LBM models (prior art).

Referring to FIG. 7, a first model (2D-1) 100 is a two-dimensional model that includes 21 velocities. Of these 21 velocities, one (105) represents particles that are not moving; three sets of four velocities represent particles that are moving at either a normalized speed (r) (110-113), twice the normalized speed (2r) (120-123), or three times the normalized speed (3r) (130-133) in either the positive or negative direction along either the x or y axis of the lattice; and two sets of four velocities represent particles that are moving at the normalized speed (r) (140-143) or twice the normalized speed (2r) (150-153) relative to both of the x and y lattice axes.

Figure 8:
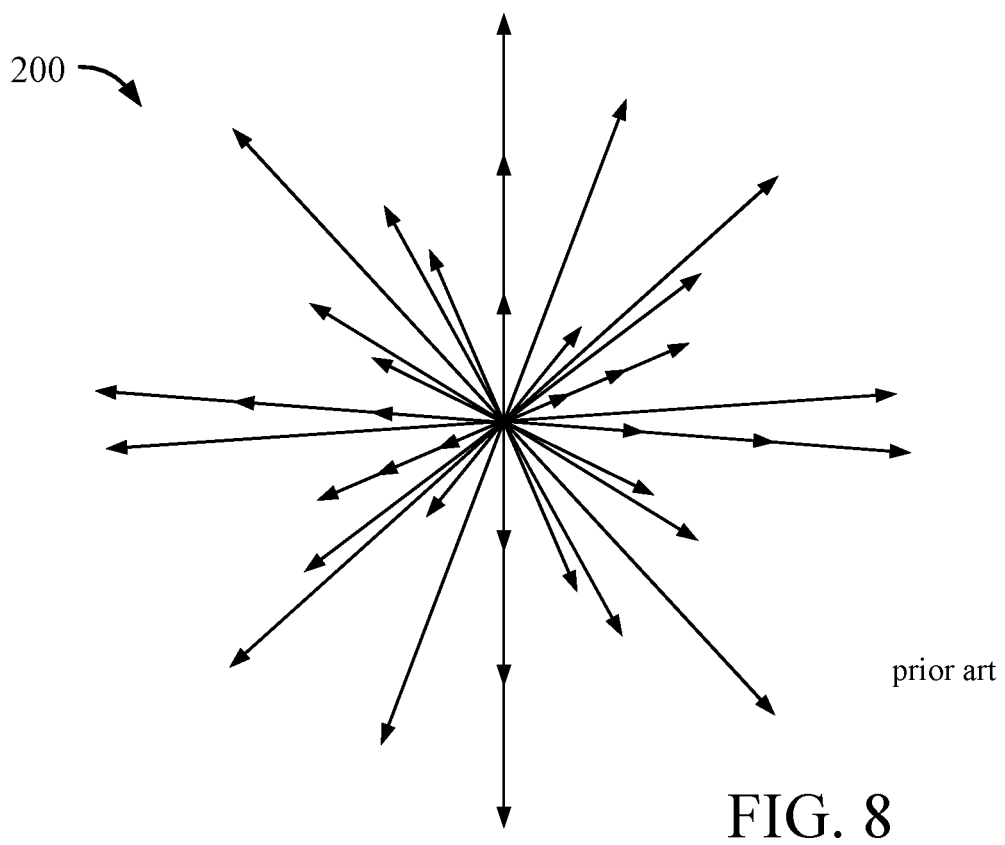

As also illustrated in FIG. 8, a second model (3D-1) 200 is a three-dimensional model that includes 39 velocities, where each velocity is represented by one of the arrowheads of FIG. 8. Of these 39 velocities, one represents particles that are not moving; three sets of six velocities represent particles that are moving at either a normalized speed (r), twice the normalized speed (2r), or three times the normalized speed (3r) in either the positive or negative direction along the x, y or z axis of the lattice; eight represent particles that are moving at the normalized speed (r) relative to all three of the x, y, z lattice axes; and twelve represent particles that are moving at twice the normalized speed (2r) relative to two of the x, y, z lattice axes.

More complex models, such as a 3D-2 model includes 101 velocities and a 2D-2 model includes 37 velocities also may be used. The velocities are more clearly described by their component along each axis as documented in Tables 1 and 2 respectively.

For the three-dimensional model 3D-2, of the 101 velocities, one represents particles that are not moving (Group 1); three sets of six velocities represent particles that are moving at either a normalized speed (r), twice the normalized speed (2r), or three times the normalized speed (3r) in either the positive or negative direction along the x, y or z axis of the lattice (Groups 2, 4, and 7); three sets of eight represent particles that are moving at the normalized speed (r), twice the normalized speed (2r), or three times the normalized speed (3r) relative to all three of the x, y, z lattice axes (Groups 3, 8, and 10); twelve represent particles that are moving at twice the normalized speed (2r) relative to two of the x, y, z lattice axes (Group 6); twenty four represent particles that are moving at the normalized speed (r) and twice the normalized speed (2r) relative to two of the x, y, z lattice axes, and not moving relative to the remaining axis (Group 5); and twenty four represent particles that are moving at the normalized speed (r) relative to two of the x, y, z lattice axes and three times the normalized speed (3r) relative to the remaining axis (Group 9).

For the two-dimensional model 2D-2, of the 37 velocities, one represents particles that are not moving (Group 1); three sets of four velocities represent particles that are moving at either a normalized speed (r), twice the normalized speed (2r), or three times the normalized speed (3r) in either the positive or negative direction along either the x or y axis of the lattice (Groups 2, 4, and 7); two sets of four velocities represent particles that are moving at the normalized speed (r) or twice the normalized speed (2r) relative to both of the x and y lattice axes; eight velocities represent particles that are moving at the normalized speed (r) relative to one of the x and y lattice axes and twice the normalized speed (2r) relative to the other axis; and eight velocities represent particles that are moving at the normalized speed (r) relative to one of the x and y lattice axes and three times the normalized speed (3r) relative to the other axis.

The LBM models described above provide a specific class of efficient and robust discrete velocity kinetic models for numerical simulations of flows in both two-and three-dimensions. A model of this kind includes a particular set of discrete velocities and weights associated with those velocities. The velocities coincide with grid points of Cartesian coordinates in velocity space which facilitates accurate and efficient implementation of discrete velocity models, particularly the kind known as the lattice Boltzmann models. Using such models, flows can be simulated with high fidelity.

Figure 9:
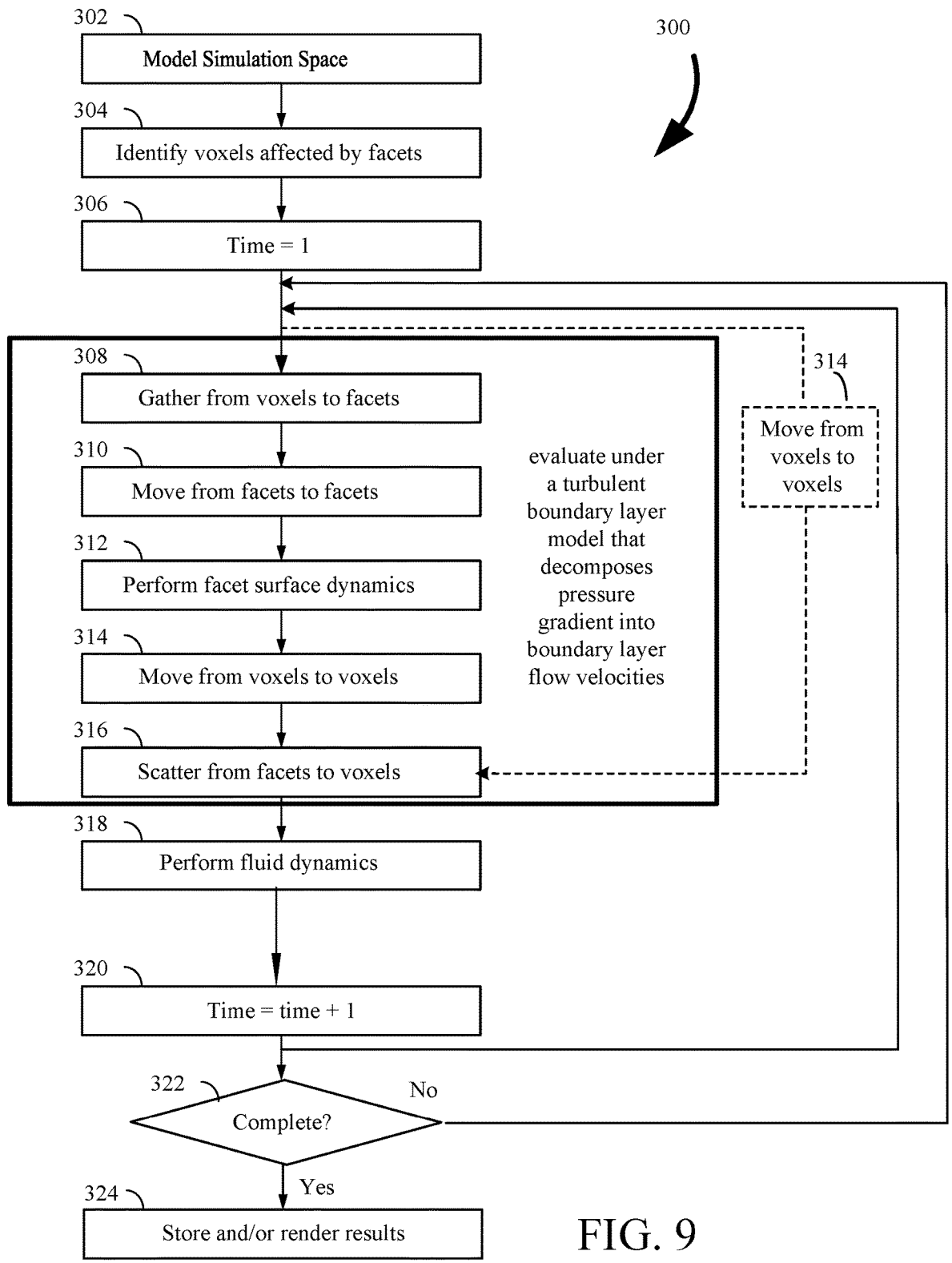
FIG. 9 is a flow chart of a procedure followed by a physical process simulation system.

Referring to FIG. 9, a physical process simulation system operates according to a procedure 300 to simulate a physical process such as fluid flow. Prior to the simulation, a simulation space is modeled as a collection of voxels (step 302). Typically, the simulation space is generated using a computer-aided-design (CAD) program. For example, a CAD program could be used to draw an micro-device positioned in a wind tunnel. Thereafter, data produced by the CAD program is processed to add a lattice structure having appropriate resolution and to account for objects and surfaces within the simulation space.

The resolution of the lattice may be selected based on the Reynolds number of the system being simulated. The Reynolds number is related to the viscosity (v) of the flow, the characteristic length (L) of an object in the flow, and the characteristic velocity (u) of the flow:

$$Re = uL/v.\qquad\text{Eq. (I-3)}$$

The characteristic length of an object represents large scale features of the object. For example, if flow around a micro-device were being simulated, the height of the micro-device might be considered to be the characteristic length. When flow around small regions of an object (e.g., the side mirror of an automobile) is of interest, the resolution of the simulation may be increased, or areas of increased resolution may be employed around the regions of interest. The dimensions of the voxels decrease as the resolution of the lattice increases.

The state space is represented as $f_i(x, t)$, where $f_i$ represents the number of elements, or particles, per unit volume in state i (i.e., the density of particles in state i) at a lattice site denoted by the three-dimensional vector x at a time t. For a known time increment, the number of particles is referred to simply as $f_i(x)$. The combination of all states of a lattice site is denoted as $f(x)$.

The number of states is determined by the number of possible velocity vectors within each energy level. The velocity vectors consist of integer linear speeds in a space having three dimensions: x, y, and z. The number of states is increased for multiple-species simulations.

Each state i represents a different velocity vector at a specific energy level (i.e., energy level zero, one or two). The velocity $c_i$ of each state is indicated with its "speed" in each of the three dimensions as follows:

$$c_i = (c_{i,x}, c_{i,y}, c_{i,z}).\qquad\text{(I-4)}$$

The energy level zero state represents stopped particles that are not moving in any dimension, i.e. $c_{stopped} = (0, 0, 0)$. Energy level one states represent particles having a ±1 speed in one of the three dimensions and a zero speed in the other two dimensions. Energy level two states represent particles having either a ±1 speed in all three dimensions, or a ±2 speed in one of the three dimensions and a zero speed in the other two dimensions.

Generating all of the possible permutations of the three energy levels gives a total of 39 possible states (one energy zero state, 6 energy one states, 8 energy three states, 6 energy four states, 12 energy eight states and 6 energy nine states.).

Each voxel (i.e., each lattice site) is represented by a state vector f(x). The state vector completely defines the status of the voxel and includes 39 entries. The 39 entries correspond to the one energy zero state, 6 energy one states, 8 energy three states, 6 energy four states, 12 energy eight states and 6 energy nine states. By using this velocity set, the system can produce Maxwell-Boltzmann statistics for an achieved equilibrium state vector.

During simulation when the process encounters in the mesh a location corresponding to a surface of a physical object or the device the process performs the above functions by evaluating under the turbulent boundary layer model that decomposes pressure gradient into boundary layer flow velocities, as discussed above.

Figure 10:
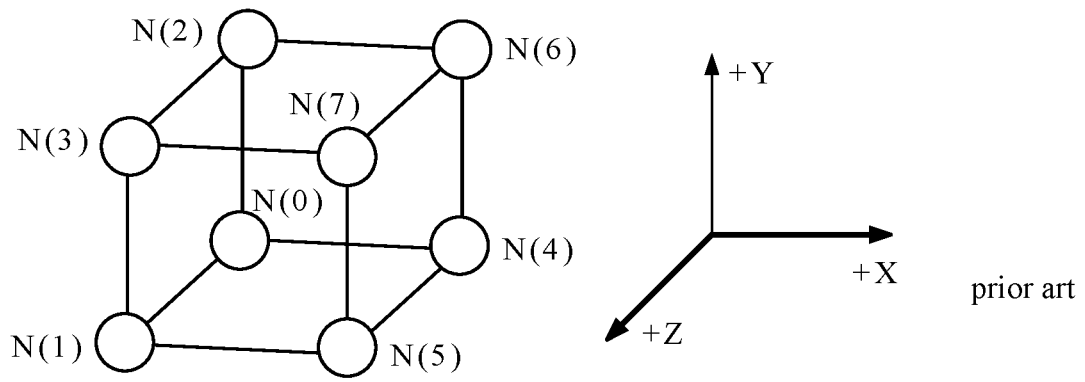
FIG. 10 is a perspective view of a microblock (prior art).

Referring now to FIG. 10, a microblock is illustrated. For processing efficiency, the voxels are grouped in 2×2×2 volumes called microblocks. The microblocks are organized to permit parallel processing of the voxels and to minimize the overhead associated with the data structure. A short-hand notation for the voxels in the microblock is defined as $N_i(n)$, where n represents the relative position of the lattice site within the microblock and $n \in \{0,1,2,\ldots,7\}$.

Figure 11A:
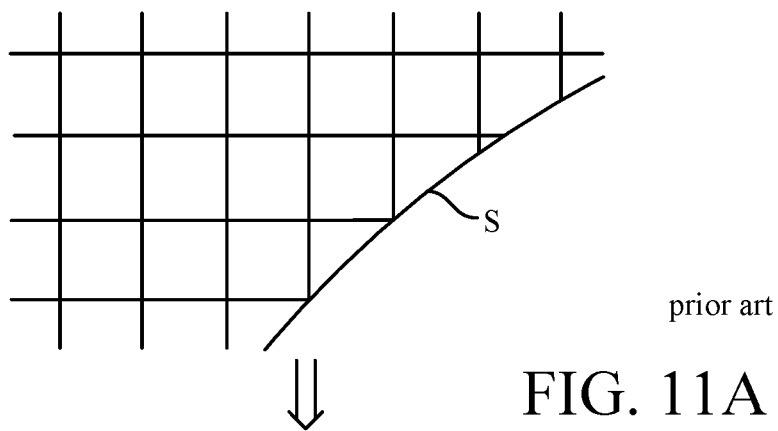
FIGS. 11A and 11B are illustrations of lattice structures (prior art) used by the system of FIG. 3.
Figure 11B:
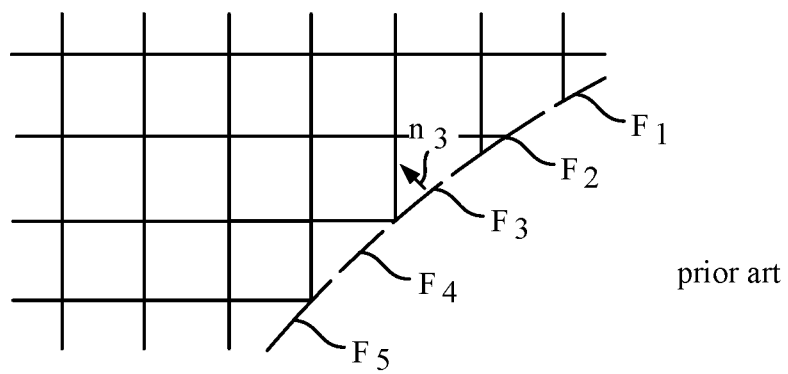

Referring to FIGS. 11A and 11B, a surface S (FIG. 11A) is represented in the simulation space (FIG. 11B) as a collection of facets $F_\alpha$:

$$S = \{F_\alpha\}\qquad\text{Eq. (I-5)}$$

where α is an index that enumerates a particular facet. A facet is not restricted to the voxel boundaries, but is typically sized on the order of or slightly smaller than the size of the voxels adjacent to the facet so that the facet affects a relatively small number of voxels. Properties are assigned to the facets for the purpose of implementing surface dynamics. In particular, each facet $F_\alpha$ has a unit normal ($n_\alpha$, a surface area ($A_\alpha$), a center location ($x_\alpha$), and a facet distribution function ($f_i(\alpha)$) that describes the surface dynamic properties of the facet.

Figure 12:
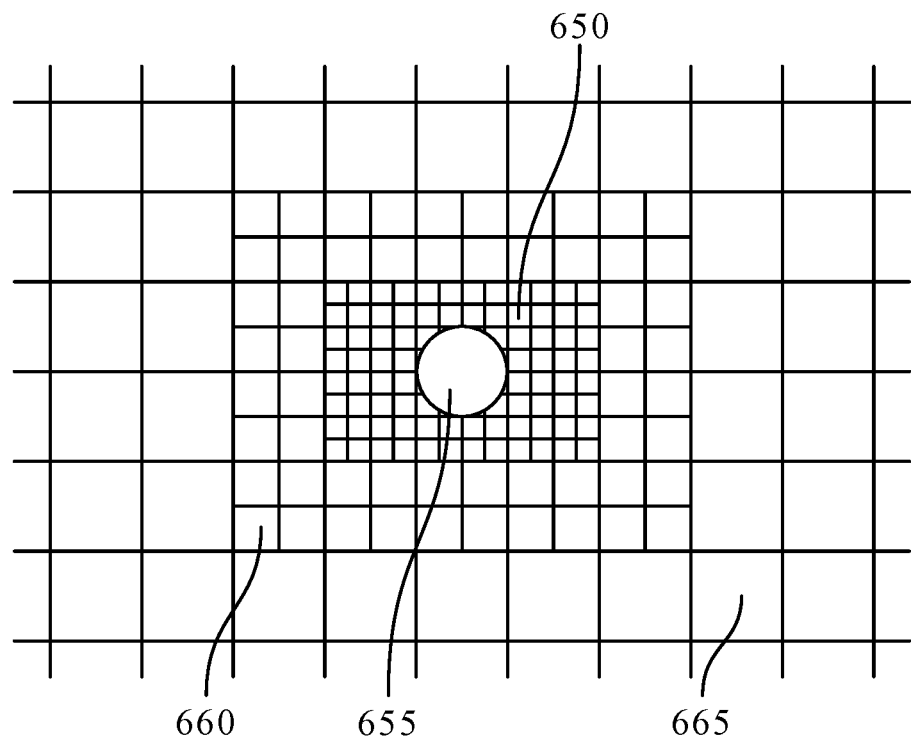
FIGS. 12 and 13 illustrate variable resolution techniques (prior art).

Referring to FIG. 12, different levels of resolution may be used in different regions of the simulation space to improve processing efficiency. Typically, the region 650 around an object 655 is of the most interest and is therefore simulated with the highest resolution. Because the effect of viscosity decreases with distance from the object, decreasing levels of resolution (i.e., expanded voxel volumes) are employed to simulate regions 660, 665 that are spaced at increasing distances from the object 655.

Figure 13:
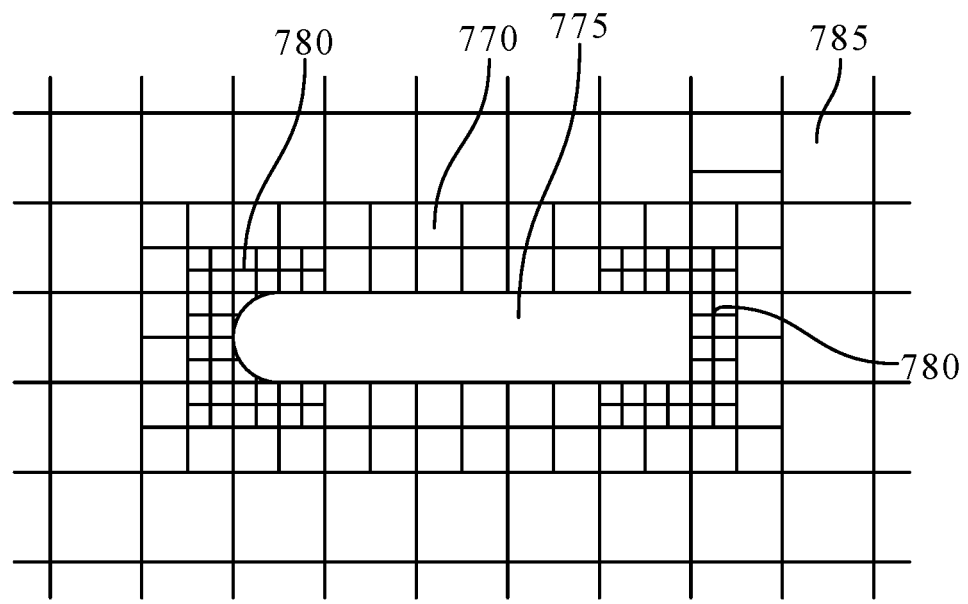

Similarly, as illustrated in FIG. 13, a lower level of resolution may be used to simulate a region 770 around less significant features of an object 775 while the highest level of resolution is used to simulate regions 780 around the most significant features (e.g., the leading and trailing surfaces) of the object 775. Outlying regions 785 are simulated using the lowest level of resolution and the largest voxels.

Identify Voxels Affected By Facets

Referring again to FIG. 9, once the simulation space has been modeled (step 302), voxels affected by one or more facets are identified (step 304). Voxels may be affected by facets in a number of ways. First, a voxel that is intersected by one or more facets is affected in that the voxel has a reduced volume relative to non-intersected voxels. This occurs because a facet, and material underlying the surface represented by the facet, occupies a portion of the voxel. A fractional factor $P_f(x)$ indicates the portion of the voxel that is unaffected by the facet (i.e., the portion that can be occupied by a fluid or other materials for which flow is being simulated). For non-intersected voxels, $P_f(x)$ equals one.

Voxels that interact with one or more facets by transferring particles to the facet or receiving particles from the facet are also identified as voxels affected by the facets. All voxels that are intersected by a facet will include at least one state that receives particles from the facet and at least one state that transfers particles to the facet. In most cases, additional voxels also will include such states.

Figure 14:
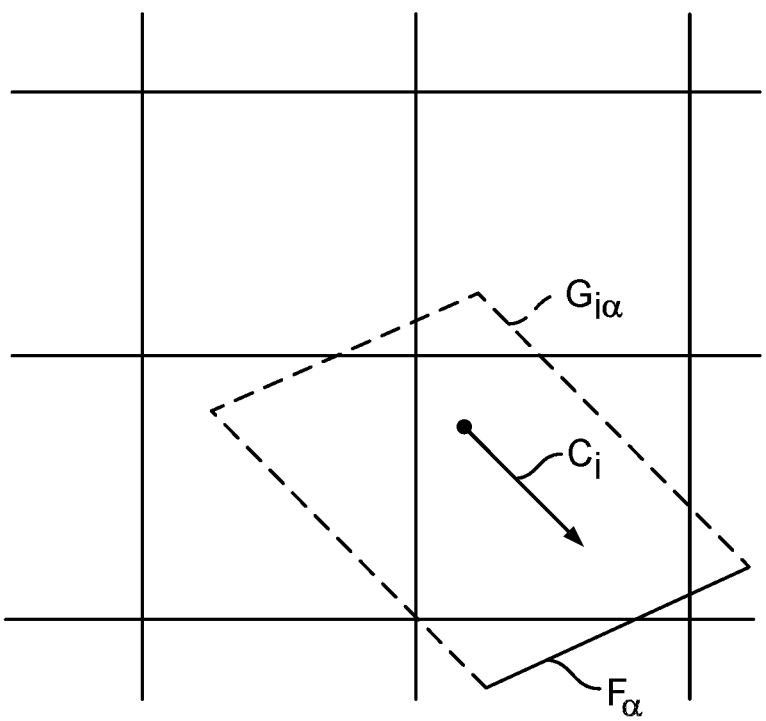
FIG. 14 illustrates regions affected by a facet of a surface (prior art).

Referring to FIG. 14, for each state i having a non-zero velocity vector $c_i$, a facet $F_\alpha$ receives particles from, or transfers particles to, a region defined by a parallelepiped $G_{i\alpha}$ having a height defined by the magnitude of the vector dot product of the velocity vector $c_i$ and the unit normal $n_\alpha$ of the facet ($|c_i n_i|$) and a base defined by the surface area $A_\alpha$ of the facet so that the volume $V_{i\alpha}$ of the parallelepiped $G_{i\alpha}$ equals:

$$V_{i\alpha}=|c_i n_\alpha|A_\alpha \qquad \text{Eq. (I-6)}$$

The facet $F_\alpha$ receives particles from the volume $V_{i\alpha}$ when the velocity vector of the state is directed toward the facet ($|c_i n_i|<0$), and transfers particles to the region when the velocity vector of the state is directed away from the facet ($|c_i n_i|>0$. As will be discussed below, this expression must be modified when another facet occupies a portion of the parallelepiped $G_{i\alpha}$, a condition that could occur in the vicinity of non-convex features such as interior corners.

The parallelepiped $G_{i\alpha}$ of a facet $F_\alpha$ may overlap portions or all of multiple voxels. The number of voxels or portions thereof is dependent on the size of the facet relative to the size of the voxels, the energy of the state, and the orientation of the facet relative to the lattice structure. The number of affected voxels increases with the size of the facet. Accordingly, the size of the facet, as noted above, is typically selected to be on the order of or smaller than the size of the voxels located near the facet.

The portion of a voxel $N(x)$ overlapped by a parallelepiped $G_{i\alpha}$ is defined as $V_{i\alpha}(x)$. Using this term, the flux $\Gamma_{i\alpha}(x)$ of state i particles that move between a voxel $N(x)$ and a facet $F_\alpha$ equals the density of state i particles in the voxel ($N_i(x)$) multiplied by the volume of the region of overlap with the voxel ($V_{i\alpha}(x)$):

$$\Gamma_{i\alpha}(x)=N_i(x)V_{i\alpha}(x). \qquad \text{Eq.(I-7)}$$

When the parallelepiped $G_{i\alpha}$ is intersected by one or more facets, the following condition is true:

$$V_{i\alpha}=\Sigma V_\alpha(x)+\Sigma V_{i\alpha}(\beta) \qquad \text{Eq. (I-8)}$$

where the first summation accounts for all voxels overlapped by $G_{i\alpha}$ and the second term accounts for all facets that intersect $G_{i\alpha}$. When the parallelepiped $G_{i\alpha}$ is not intersected by another facet, this expression reduces to:

$$V_{i\alpha}=\Sigma V_{i\alpha}(x). \qquad \text{Eq. (I-9)}$$

Perform Simulation

Once the voxels that are affected by one or more facets are identified (step 304), a timer is initialized to begin the simulation (step 306). During each time increment of the simulation, movement of particles from voxel to voxel is simulated by an advection stage (steps 308-316) that accounts for interactions of the particles with surface facets. Next, a collision stage (step 318) simulates the interaction of particles within each voxel. Thereafter, the timer is incremented (step 320). If the incremented timer does not indicate that the simulation is complete (step 322), the advection and collision stages (steps 308-320) are repeated. If the incremented timer indicates that the simulation is complete (step 322), results of the simulation are stored and/or displayed (step 324).

Simulation Application

The purpose of the simulation processes discussed herein is to model real world physical objects. In particular, the features of boundaries encountered by the presence of real world objects is addressed by the above description. Accurate prediction of various physical parameters, such as heat, noise, drag, etc. are important considerations in the field of fluid dynamics. Accuracy in these predictions are predicated on the ability to model fluid flows accurately irrespective of how the fluid flows impact a physical surface of an object that is being simulated.

For example, it is applicable to high MACH applications such as fluid simulations around and about airplanes/jets and the like, and any other applications where turbulent air flow at high Mach speeds is modeled. That is, when turbulent boundary layer modeling is used with the approach described above this decomposes the boundary layer flow velocity into three directions, with the velocity component normal to the wall being zero, and the other two being the velocity direction parallel to the wall-tangent part of the pressure gradient and a velocity direction perpendicular to the wall-tangent part of the pressure gradient. With these latter two components, it is straightforward to apply appropriate wall modeling based on their two different directions, to thus accurately model any wall surface irrespective of whether or not the fluid flow along a solid surface is in the same direction as a curvature direction, as discussed above.

Embodiments of the subject matter and the functional operations described in this specification can be implemented in digital electronic circuitry, tangibly-embodied computer software or firmware, computer hardware (including the structures disclosed in this specification and their structural equivalents), or in combinations of one or more of them. Embodiments of the subject matter described in this specification can be implemented as one or more computer programs (i.e., one or more modules of computer program instructions encoded on a tangible non-transitory program carrier for execution by, or to control the operation of, data processing apparatus). The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example, a programmable processor, a computer, or multiple processors or computers. The apparatus can also be or further include special purpose logic circuitry (e.g., an FPGA (field programmable gate array) or an ASIC (application-specific integrated circuit)). In addition to hardware, the apparatus can optionally include code that creates an execution environment for computer programs (e.g., code that constitutes processor firmware, a protocol stack, a database management system, an operating system, or a combination of one or more of them).

A computer program, which can also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document, in a single file dedicated to the program in question, or in multiple coordinated files (e.g., files that store one or more modules, sub-programs, or portions of code)). A computer program can be deployed so that the program is executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry (e.g., an FPGA (field programmable gate array) or an ASIC (application-specific integrated circuit)).

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data (e.g., magnetic, magneto-optical disks, or optical disks), however, a computer need not have such devices. Moreover, a computer can be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive), to name just a few).

Computer-readable media suitable for storing computer program instructions and data include all forms of non-volatile memory on media and memory devices, including by way of example semiconductor memory devices (e.g., EPROM, EEPROM, and flash memory devices), magnetic disks (e.g., internal hard disks or removable disks), magneto-optical disks, and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device for displaying information to the user and a keyboard and a pointing device. Other kinds of devices can be used.

Embodiments of the subject matter described in this specification can be implemented in a computing system that includes a back-end component (e.g., as a data server), or that includes a middleware component (e.g., an application server), or that includes a front-end component (e.g., a client computer having a graphical user interface or a web browser through which a user can interact with an implementation of the subject matter described in this specification), or any combination of one or more such back-end, middleware, or front-end components. The components of the system can be interconnected by any form or medium of digital data communication (e.g., a communication network). Examples of communication networks include a local area network (LAN) and a wide area network (WAN) (e.g., the Internet).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a user device (e.g., for purposes of displaying data to and receiving user input from a user interacting with the user device), which acts as a client. Data generated at the user device (e.g., a result of the user interaction) can be received from the user device at the server.

While this specification contains many specific implementation details, these should not be construed as limitations on the scope of any invention or on the scope of what can be claimed, but rather as descriptions of features that can be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing can be advantageous.

What is claimed is:

1. A computer-implemented method for simulating a fluid flow comprising the steps of:
receiving by one or more computer systems, a model of a simulation space including a lattice structure represented as a collection of voxels, and a representation of at least one surface of a physical object, with voxels in the collection of voxels having appropriate resolutions to account for the at least one surface of the physical object;

storing in a memory of the one or more computer systems, a momentum state for the voxels in the collection of voxels;

performing interaction operations on elements of a simulated fluid flow for different momentum states for at least some of the voxels of the collection of voxels;

performing surface interaction operations for modeling fluid interactions for elements of the fluid flow between the at least one surface and a location near the at least one surface, with modeling including modeling a wall shear stress direction that is not parallel to a boundary layer flow velocity direction; and performing move operations on the collection of voxels to reflect movement of elements of the fluid flow to new voxels of the collection of voxels.

2. The method of claim 1, wherein storing in the memory the momentum state includes storing, in the memory state, vectors for a plurality of voxels, the state vectors comprising a plurality of entries that correspond to particular momentum states of a plurality of possible momentum states at a voxel of the collection of voxels.

3. The method of claim 2, wherein performing interaction operations on different momentum states for at least some of the voxels of the collection of voxels includes performing interaction operations on the state vectors, the interaction operations modelling interactions between elements of the fluid flow for different momentum states.

4. The method of claim 1, wherein the surface interaction operations model interactions between elements of the fluid flow at the at least one surface and at least one voxel of the collection of voxels near the at least one surface.

5. The method of claim 1, wherein the collection of voxels are representative of locations in the simulation space.

6. The method of claim 1, wherein performing surface interaction operations accounts for perpendicular pressure components.

7. The method of claim 1, wherein performing surface interaction operations include evaluating the boundary layer flow velocity according to two velocity directions.

8. A system for simulating a fluid flow comprises:
one or more processor devices;
memory operatively coupled to the one or more processor devices;
storage media storing a computer program comprising instructions to cause the system to:
receive a model of a simulation space that includes a lattice structure represented as a collection of voxels, and a representation of at least one surface of a physical object, with the collection of voxels having appropriate resolutions to account for the at least one surface of the physical object;
store in a memory a momentum state for the voxels in the simulation space;
perform interaction operations on different momentum states for at least some of the voxels;
perform surface interaction operations for modeling interactions between the at least one surface and a location near the at least one surface, with modeling including modeling a wall shear stress direction that is not parallel to a boundary layer flow velocity direction; and
perform move operations on the collection of voxels to reflect movement of elements of the fluid flow to new voxels of the collection of voxels.

9. The system of claim 8 wherein instructions to store in the memory the momentum state include instructions to:
store in the memory state, vectors for a plurality of voxels, the state vectors comprising a plurality of entries that correspond to particular momentum states of a plurality of possible momentum states at a voxel of the collection of voxels.

10. The system of claim 9 wherein instructions to perform interaction operations on different momentum states for at least some of the voxels of the collection of voxels include instructions to:
perform interaction operations on the state vectors, the interaction operations modelling interactions between elements of the fluid flow for different momentum states.

11. The system of claim 8 wherein instructions to perform include instructions to:
perform surface interaction operations accounts for perpendicular pressure components.

12. The system of claim 8 wherein instructions to perform include instructions to:
evaluate the boundary layer flow velocity according to two velocity directions.

13. The system of claim 8, wherein the surface interaction operations model interactions between elements of the fluid flow at the at least one surface and at least one voxel of the collection of voxels near the at least one surface.

14. A computer program product for simulating a fluid flow, the computer program product tangibly stored on a non-transitory computer readable storage medium, the computer program product comprising instructions to cause a system to:
receive a model of a simulation space that includes a lattice structure represented as a collection of voxels, and a representation of at least one surface of a physical object, with the collection of voxels having appropriate resolutions to account for the at least one surface of the physical object;
store in a memory a momentum state for the voxels in the simulation space;
perform interaction operations on different momentum states for at least some of the voxels;
perform surface interaction operations for modeling interactions between the at least one surface and a location near the at least one surface, including modeling a wall shear stress direction that is not parallel to a boundary layer flow velocity direction; and
perform move operations on the collection of voxels to reflect movement of elements of the fluid flow to new voxels of the collection of voxels.

15. The computer program product of claim 14 wherein instructions to store in the memory the momentum state include instructions to:
store in the memory state, vectors for a plurality of voxels, the state vectors comprising a plurality of entries that correspond to particular momentum states of a plurality of possible momentum states at a voxel of the collection of voxels; and
perform interaction operations on different momentum states for at least some of the voxels in the collection of voxels include instructions to perform interaction operations on the state vectors, the interaction operations modelling interactions between elements of the fluid flow for different momentum states.

16. The computer program product of claim 14 wherein instructions to perform include instructions to:
   perform surface interaction operations accounts for perpendicular pressure components.

17. The computer program product of claim 14 wherein instructions to perform include instructions to:
   evaluate the boundary layer flow velocity according to two velocity directions.

18. The computer program product of claim 14, wherein the instructions to perform surface interaction operations, model interactions between elements of the fluid flow at the at least one surface and at least one voxel of the collection of voxels near the at least one surface.

* * * * *